United States Patent
Paul et al.

(10) Patent No.: US 12,055,602 B2
(45) Date of Patent: Aug. 6, 2024

(54) SYSTEM AND METHOD OF MONITORING ELECTRICAL DEVICES TO DETECT ANOMALY IN THE ELECTRICAL DEVICES

(71) Applicant: Vigyanlabs Innovations Private Limited, Mysore (IN)

(72) Inventors: Mousumi Paul, Howrah (IN); Sanjaya Ganesh, Bangalore (IN); Srivatsa Krishnaswamy, Bangalore (IN)

(73) Assignee: VIGYANLABS INNOVATIONS PRIVATE LIMITED, Mysore (IN)

( * ) Notice: Subject to any disclaimer, the term of this patent is extended or adjusted under 35 U.S.C. 154(b) by 859 days.

(21) Appl. No.: 17/098,217

(22) Filed: Nov. 13, 2020

(65) Prior Publication Data
US 2021/0148996 A1 May 20, 2021

(51) Int. Cl.
*G01R 31/56* (2020.01)

(52) U.S. Cl.
CPC .................................. *G01R 31/56* (2020.01)

(58) Field of Classification Search
CPC ..... G01R 31/56; G01R 22/068; G01R 22/063
See application file for complete search history.

(56) References Cited

U.S. PATENT DOCUMENTS

| | | | |
|---|---|---|---|
| 8,781,767 B2* | 7/2014 | Hoogs | H02J 3/00 702/179 |
| 9,465,376 B2* | 10/2016 | Arya | G05B 15/02 |
| 2013/0046493 A1* | 2/2013 | Hoogs | H02J 3/00 702/61 |
| 2017/0205451 A1* | 7/2017 | Moinuddin | G01R 31/52 |
| 2018/0285988 A1* | 10/2018 | Leontitsis | G01D 4/008 |
| 2019/0205774 A1* | 7/2019 | Ba | G06N 20/20 |
| 2021/0116895 A1* | 4/2021 | Paul | G06F 11/3447 |
| 2022/0020130 A1* | 1/2022 | Lin | G06T 7/11 |

* cited by examiner

*Primary Examiner* — Eyob Hagos

(57) ABSTRACT

A system and method configured in an electrical device for providing a monitoring solution that identifies the intermittent or anomalous behavior of electronic/electric appliances when in use, comprising: receiving present real-time power features like current, voltage, power factor, power consumption of the associated device, and maintaining a history of past real-time readings of the device in its ideal working periods; forming rule-based clusters of different internal states of the device from the past history data at ideal working periods; determining which of said present readings are correlated; computing a deviation between at least some of said present and at least some of said clusters; and declaring an anomaly when said present readings deviation exceeds a predetermined threshold from all of the said clusters.

8 Claims, 6 Drawing Sheets

SYSTEM AND METHOD OF MONITORING ELECTRICAL DEVICES TO DETECT ANOMALY IN THE ELECTRICAL DEVICES

BACKGROUND

Technical Field

The embodiments herein generally relate to an anomaly detection in electrical devices and more specifically to a method and system for real time monitoring of powered-on electrical devices in order to detect an electrical anomaly while the electrical device is in use, in addition to identification of anomaly occurrences and intermittent behaviors at operational environment.

Description of the Related Art

Anomalous and intermittent behavior is a typical phenomenon of electrical devices. Identification of the root cause of such anomalous and intermittent behavior becomes a leading concern of electronic products manufacturers. There are various causes of such intermittent behavior; it could be due to inappropriate power quality or software/hardware, improper operational conditions and usage or any internal damage etc. Such events can have an unforeseen impact on the reliability of the product. Most of the time customers send back these products back to the manufacturer and the manufacturers may test the returned products extensively. This whole process creates an overhead in financial costing and results in financial losses. Sometimes the exact fault cannot be duplicated. Producing the real operational functionality is also not cost effective and we cannot produce the exact test case as it occurred in the real field. Therefore, it is important to understand the occurrences of anomalies and intermittent behaviors at operation environments (or fields) themselves.

Many factors may cause intermittent faults, including software, hardware, operational condition, and usage. Intermittent faults may be activated or deactivated by temperature, voltage, and frequency changes, power factor changes. For example, when products are operated outside their intended specifications, unknown or unforeseen events can occur. Such events can have an unforeseen impact on the reliability of the product.

There has been an existing method for monitoring the health of power electronics by measuring a switching time of the power electronic device and using the switching time to determine a diagnostic condition of the power electronic device and/or the gate driver. The limitation of this approach is that total switching time does not identify the intermittent behavior which occurs for small duration.

One existing approach provides a centralized system for real time monitoring and controlling system of electrical devices; the central system receives nodes' information placed at facilities, over network and activates/deactivates nodes in order to balance the load and thereby proactively conserve power consumption as well as avoid expensive spikes in power consumption. The current effort is to maintain a balance in overall power consumption, but this is not a diagnostic method to identify the anomaly and provide a long term solution.

Another approach describes an anomaly detector for retrieving an anomaly detection rule from an anomaly detection rule database, the rule having an identification of a required input, a formula, and a threshold reference value, for a detection of an anomaly; However, the anomaly detection rule database depends on threshold reference value being determined using a nominal value for said input for said relevant element. Therefore, the threshold reference value is required to be provided as an input, which is an additional appliance specific information, and it may not be available always.

Another existing method obtains two different time power series and compares them to generate a dissimilarity matrix. A dimensionality reduction equation is applied to the dissimilarity matrix to obtain a low dimensional embedding of the power data. A probability score of each of the time series being anomalous is then calculated. Time series data is very sensitive to regular usage pattern which is not as reliable when usage pattern changes due to the demand expectation.

Another existing approach describes a system and methods for performing data anomaly detection and to accurately assess baseline power consumption. A system can be operable to receive energy consumption data of a location. The system selects, based at least in part on a collection period of the energy consumption data, an algorithm for detecting anomalies in the energy consumption data and performs the algorithm on the energy consumption data to detect the anomalies in the energy consumption data and determines an energy consumption baseline for the location, based at least in part, on a result of the algorithm. The main factor of this approach is the variation of power consumption but sometimes power consumption may not differ too much but any of the power data parameters like power factor change, voltage change is not accurately diagnosed as a responsible factor of anomaly. The long term based power factor change or voltage fluctuation, reveals that the power supply is of poor quality which sis most of the times an important factor of anomaly creation.

Yet another existing approach is a power monitoring system to monitor electrical power supply to electrical equipment. The monitor includes an energy saving device to reduce unnecessary power consumption. A control means for enabling control of power consumption of electrical devices in response to the data output of the monitored power consumption. The application is not generic and is not applicable on all devices with lack of control inputs.

Accordingly, there remains a need for a simple and cost effective monitoring system that can capture the anomalous behavior of electric appliances.

SUMMARY

Foregoing the above problem, a real time monitoring and diagnostic system can help to capture real time anomalous behavior of electrical appliances. A system and method to discover different internal states of electrical appliances during ideal working periods and find out anomalous and intermittent behavior at operational fields, provided on component and location basis, anomaly detection, power consumption, in addition to incorporating a working status of internal devices is provided.

A system of monitoring electrical devices to detect anomaly in an electrical device, comprising at least one memory that stores computer-executable instructions; at least one processor configured to access the at least one memory, wherein the at least one processor is configured to execute the computer-executable instructions to: receive, from a data provider, energy consumption data of at-least one electrical device on a defined interval basis, wherein energy consumption data includes current, voltage, power consumption of the at least one electrical device; select, based at least in part on a collection period of the energy consumption data, an algorithm for detecting anomalies in the energy consumption data; perform the algorithm on the energy consumption data to detect the anomalies in the energy consumption data; and determine an energy consumption baseline for the location based on at least in part on a result of the algorithm; wherein the algorithm comprises a clustered based pattern matching algorithm.

In an embodiment, the at least one processor is further configured to execute the computer-executable instructions to perform cluster-based algorithm and classification-based algorithm on baseline energy consumption data for each appliance separately and label those baseline data as a benchmark database for anomaly detector and store in a memory.

In an embodiment, the at least one processor is further configured to execute the computer-executable instructions to filter the detected anomalies from the energy consumption data and label them as anomalies in the database and also store corresponding current parameters responsible for the anomaly.

In an embodiment, the at least one processor is further configured to execute the computer-executable instructions to estimate energy consumption at the location based at least in part on the filtered energy consumption data, wherein unusual energy consumption in an electrical device or equipment can be identified as an anomaly.

In an embodiment, the classification-based algorithm is selected when a real time energy data is received from the data provider and detects the class of the energy data point.

One or more non-transitory computer-readable media storing computer-executable instructions that, when executed by at least one processor, configure the at least one processor to perform operations comprising: receiving, from a data provider, energy consumption data of an electrical device, determining a collection period of the energy consumption data; selecting, based at least in part on the collection period of the energy consumption data, an algorithm for detecting anomalies in the energy consumption data; performing the algorithm on the energy consumption data to detect the anomalies in the energy consumption data; determining an energy consumption baseline for the location based at least in part on a result of the algorithm; labelling, based at least in part on the result of the algorithm, the detected anomalies; and filtering the detected anomalies from the energy consumption, wherein the algorithm comprises an cluster-based algorithm, a classification-based algorithm, wherein the cluster-based algorithm is selected when no threshold value exists from historical data or baseline data.

In an embodiment, one or more non-transitory computer-readable media storing computer-executable instructions when executed by at least one processor, wherein a generic algorithm of detecting anomalies on heterogenous electric or electrical device on real time basis.

In an embodiment, the one or more non-transitory computer-readable media storing computer-executable instructions when executed by at least one processor, wherein an alarm dashboard to display alert on anomalies occurrence times.

In an embodiment, the system includes a module takes the baseline energy data of individual appliance and applies clustering algorithm on the baseline energy data. Clustering may be used to divide the population or energy data points into a number of cluster groups or clusters or states such that energy data points in the same cluster groups are more similar to other energy data points in the same cluster group than those in other cluster groups. Multiple cluster groups may be formed from the baseline energy data and each of these cluster group represent the different internal usage state of the respective appliance when it operates in normal modes. Wherein another embodiment of the system includes a method that classifies these clusters into one or more classes based on different internal usage state of the individual appliance and selects the respective power data parameters (current, voltage, power factor, power consumption) as the one or more class features. The method may use the baseline energy data into a supervised learning module and trains the model with power data parameters as features and internal state as known one or more classes derived from the baseline energy data. The trained model for individual category of appliance is stored in the system.

In another embodiment, the system consists of a set of rules for anomaly detection in energy consumption data by considering the statistical metrics of individual power data parameters like power factor, current, voltage and power consumption. Wherein another set embodiment uses the trained model of respective appliances to detect the anomaly in appliances.

A yet another aspect of the embodiments herein pertains to a module that receives the real time energy data and verifies with the anomaly detection rules of the respective appliance and if the present reading violates any of the said anomaly rules, and then the reading is considered as anomalous point or anomalous data of the appliance. Once the anomalous phenomena persist for more than a threshold duration, the system may generate an alarm about the intermittent or anomalous behavior of the system.

In another embodiment of the system consists of a dashboard that reflects complete historical energy data usage of the appliances along with anomaly points. The dashboard also contains history of anomalous behavior of individual appliances with the corresponding energy parameters responsible for the anomaly.

These and other aspects of the embodiments herein will be better appreciated and understood when considered in conjunction with the following description and the accompanying drawings. It should be understood, however, that the following descriptions, while indicating preferred embodiments and numerous specific details thereof, are given by way of illustration and not of limitation. Many changes and modifications may be made within the scope of the embodiments herein without departing from the spirit thereof, and the embodiments herein include all such modifications.

BRIEF DESCRIPTION OF THE DRAWINGS

The embodiments herein will be better understood from the following detailed description with reference to the drawings, in which.

DETAILED DESCRIPTION

Figure 1:
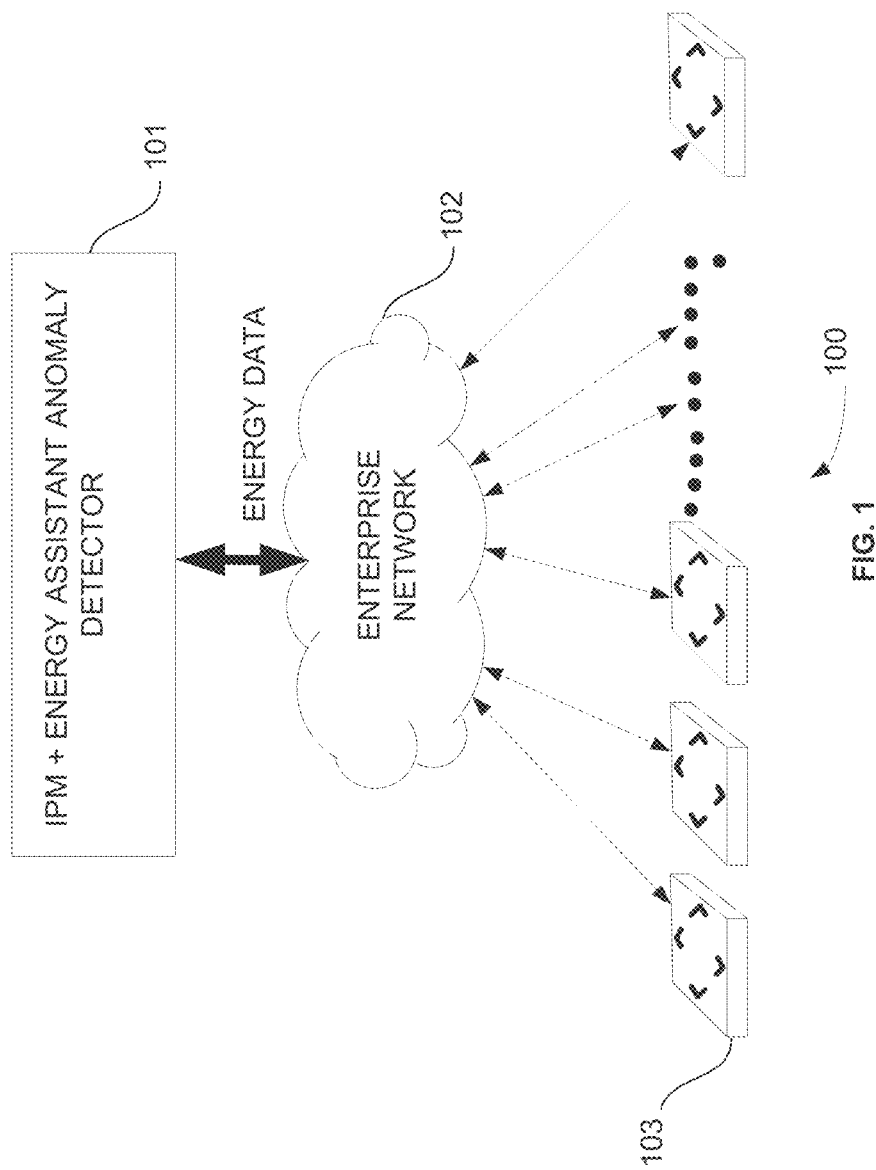
FIG. 1 illustrates an architecture of anomaly detection system for performing anomaly detection according to an embodiment herein.

The embodiments described herein, and the various features and advantageous details thereof are explained more fully with reference to the non-limiting embodiments that are illustrated in the accompanying drawings and detailed in the following description. Descriptions of well-known components and processing techniques are omitted in order to not unnecessarily obscure what is being disclosed. The examples used herein are intended merely to facilitate an understanding of the ways in which the embodiments herein may be practiced and to further enable those of skill in the art to practice the embodiments herein. Accordingly, the examples should not be construed as limiting the scope of the embodiments herein and otherwise claimed. In the drawings, the size and relative sizes of layers and regions may be exaggerated for clarity.

Referring now to the drawings, and more particularly to FIGS. 1 through FIG. 6, where similar reference characters denote corresponding features consistently throughout the figures, there are shown preferred embodiments.

Certain embodiments of the systems and methods provide a monitoring solution that identifies the intermittent or anomalous behavior of electrical devices when in use, wherein baseline energy consumption data are used for measuring and detecting anomalous behavior of the appliances.

The embodiment of the system comprises a power monitoring system or service that receives and/or records energy consumption data from electrical devices, wherein the system also comprises a database that stores energy consumption data; wherein energy consumption data includes current, voltage, power consumption in watts/kilowatts and power factor of each electrical appliances;

In one example embodiment of the invention provides a system and method of selecting baseline energy consumption data and performs clustering-based algorithms to explore different internal usage states of specific electrical appliance, wherein another method performs classification-based algorithm that labels the different internal usage states of respective appliances, wherein the system also comprises a rule engine that generates a set of anomaly detection rules for the specific appliance.

Further in one embodiment of the system receives real time energy consumption data and stores in energy database. Wherein another embodiment of the system uses baseline energy data and forms clusters of different internal usage states of individual appliances and labeled them; wherein a rule engine considers those labeled clusters of individual appliances and generates a set of anomaly detection rules for individual appliances and forms repository of anomaly detection. The anomaly rules consist of a classification methods that classify the real time power readings with the internal usage classes (as in classification) of corresponding appliances and if a particular measurement does or does not belong to any of the existing internal usage classes obtained using baseline data, then that particular measurement is considered as normal or anomalous correspondingly.

Wherein another embodiment of the system consists of a method that receives the real time readings from individual appliances and verifies with anomaly rules of the respective appliance from the anomaly rules repository. If the real time power readings violate any of the anomaly rules and these phenomena persist for more than a threshold duration, then an alert is generated for the respective appliance about its anomalous behavior. The method also finds the particular energy parameters that are responsible for exhibiting the anomaly. It verifies each real time energy parameter against the anomaly rules generated by rule engine for specific appliances and if it finds any of the parameters do not satisfy those rules then anomaly detector records that parameter as responsible for anomaly and save into anomaly database. For example, in real time usage if an appliance consumes more power than usual quantity that it draws in baseline usage mode, then the anomaly detector verifies each energy parameter with the state threshold rules of that appliance generated by rule engine using specific electrical device's baseline data, and may find power and current flow, as responsible energy parameters for the anomaly. Sometimes due to abnormal inductive/capacitive effect an appliance's power factor may change abnormally that may not have occurred during baseline use mode. This time the anomaly detector records power factor as the responsible energy parameter for occurrence of anomaly. The anomaly detector also records the time when such anomalous behavior persists in the appliances. The anomaly rules also consist of some basic electrical parameters ranges as threshold to identify anomaly. For example, the good quality of voltage supply ranges between 225-235 volts.

In another embodiment of the system comprises a dashboard that displays all the anomaly points with their time of occurrences and persistence duration. It also displays corresponding energy parameters that are responsible for the anomaly. From this dashboard user can identify any anomaly's time of occurrence along with its responsible energy parameters and helps in further investigation into the root cause. For example, if any electrical appliances produce more inductive load than its recommended level then its power factors may change abnormally, and user easily identifies appliances internal states. In another dashboard, time series energy distribution among the different electrical appliances has been shown. It helps user to plan and distribute energy optimally.

The time series energy distribution also helps to identify anomaly behavior of the appliances when unusual energy pattern is observed. For example, if any electrical appliance consumes lot of energy which it basically does not consume in ideal operational environment, the anomaly detector 206 detect and alert about the anomalous behavior of the appliance. The time series energy consumption data also helps to estimate the total demanded energy usage at the location.

FIG. 1 illustrates an architecture 100 of anomaly detection system for performing anomaly detection according to an embodiment herein. The architecture 100 includes an Energy Assistant Anomaly Detector System 101, an enterprise network 102 and an energy data provider 103 at a location. The location may be an organization or an environment where multiple electrical appliances are connected within an enterprise network. The location may be a home or an industrial location. In some embodiments, the Energy Assistant Anomaly Detector System 101 is connected within an enterprise network with multiple energy data providers. Further each energy data provider is connected with respective, one or more electrical appliances and include one or more power sensors to capture energy parameters. The one or more electrical devices may be refrigerator, a heater, an air conditioner, a microwave, a computer, specialized home or industrial appliances, but not limited thereof. The energy data provider 103 captures (i) current, (ii) voltage, (iii) power, and (iv) power factor for the one or more electrical devices. In some embodiments, the Energy Assistant Anomaly Detector System 101 includes one or more trained machine learning models.

An embodiment herein pertains to the Energy Assistant Anomaly Detector System 101 configured in an electrical device to monitor and detect anomalous and intermittent behavior of the one or more electrical devices. The embodiment can include multiple sensors and a collector to get power consumption data from individual appliances over enterprise network; wherein another module to collect baseline energy data of individual electric device or an appliance from the one or more electrical devices. The baseline energy data may be collected over a period of time when the appliance is in use as per ideal usage recommendation of the respective manufacturer. The baseline energy data is the energy consumption data of the one or more electrical devices.

Figure 2:
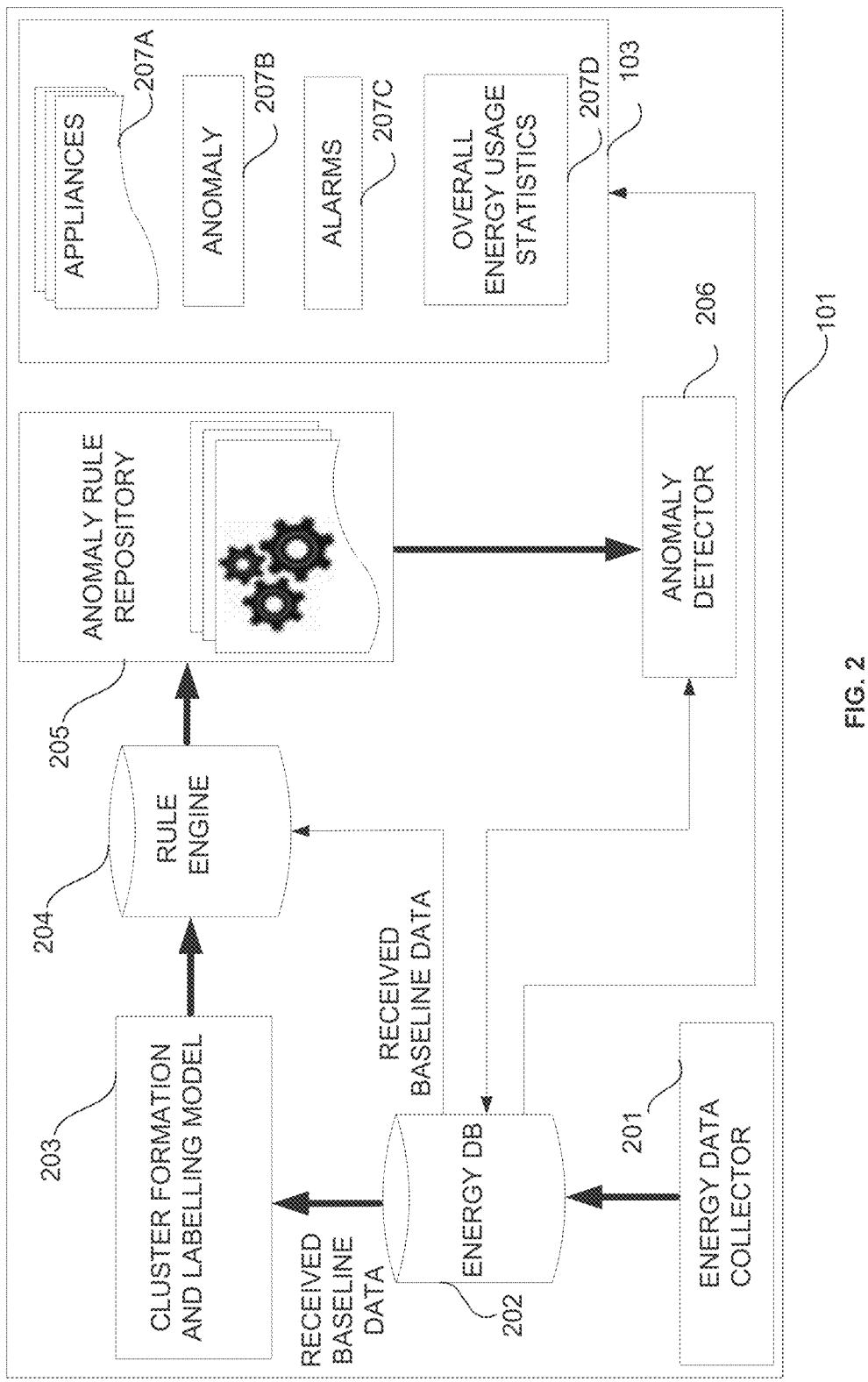
FIG. 2 illustrates an exploded view of Energy Assistant Anomaly Detector System according to an embodiment herein.

FIG. 2 illustrates an Energy Assistant Anomaly Detector System 101 according to an embodiment herein. The Energy Assistant Anomaly Detector System 101 includes an energy data collector module 201 that establishes a TCP connection with the energy data provider 103 and collects energy data in a defined interval and stores the energy data to an energy database 202. Energy database stores baseline energy data as well as real time energy data collected by the energy data collector module 201. The baseline energy data is collected when the one or more electrical appliances are in use, within recommended usage conditions. The Energy Assistant Anomaly Detector System 101 further includes a cluster formation and internal usage state labelling module 203. The cluster formation and internal usage state labelling module 203 monitors the baseline energy data of the one or more electrical devices and filters out all the data points where power quality does not meet standard requirements, and the one or more electrical devices are monitored to be running in strictly guided and recommended usage environment. From this baseline energy data of respective appliances from the one or more electrical devices. The cluster formation and internal usage state labelling module 203, explores all the internal working states from the one or more electrical devices, by performing cluster-based analysis of the baseline energy data shown in FIG. 4. After that the 'clustered' data points are labelled with a class associated to the internal working state. Further, a classification machine learning model is trained with the class and the labelled data points.

The trained classification machine learning model is used for anomaly detection to identify the internal working class based on the baseline energy data. Further, datapoints or outliers are identified which don't belong to any cluster by the trained classification machine learning model.

In one embodiment, the Energy Assistant Anomaly Detector System 101 further includes a rule engine 204 that generates a set of anomaly rules for respective the one or more electrical devices. The rule engine 204 considers the baseline energy data from energy data and the internal states obtained by the cluster formation and internal usage state labelling module 203, based on that it generates a threshold and constraints for anomaly detection and saves it in an anomaly rule repository 205.

Figure 3:
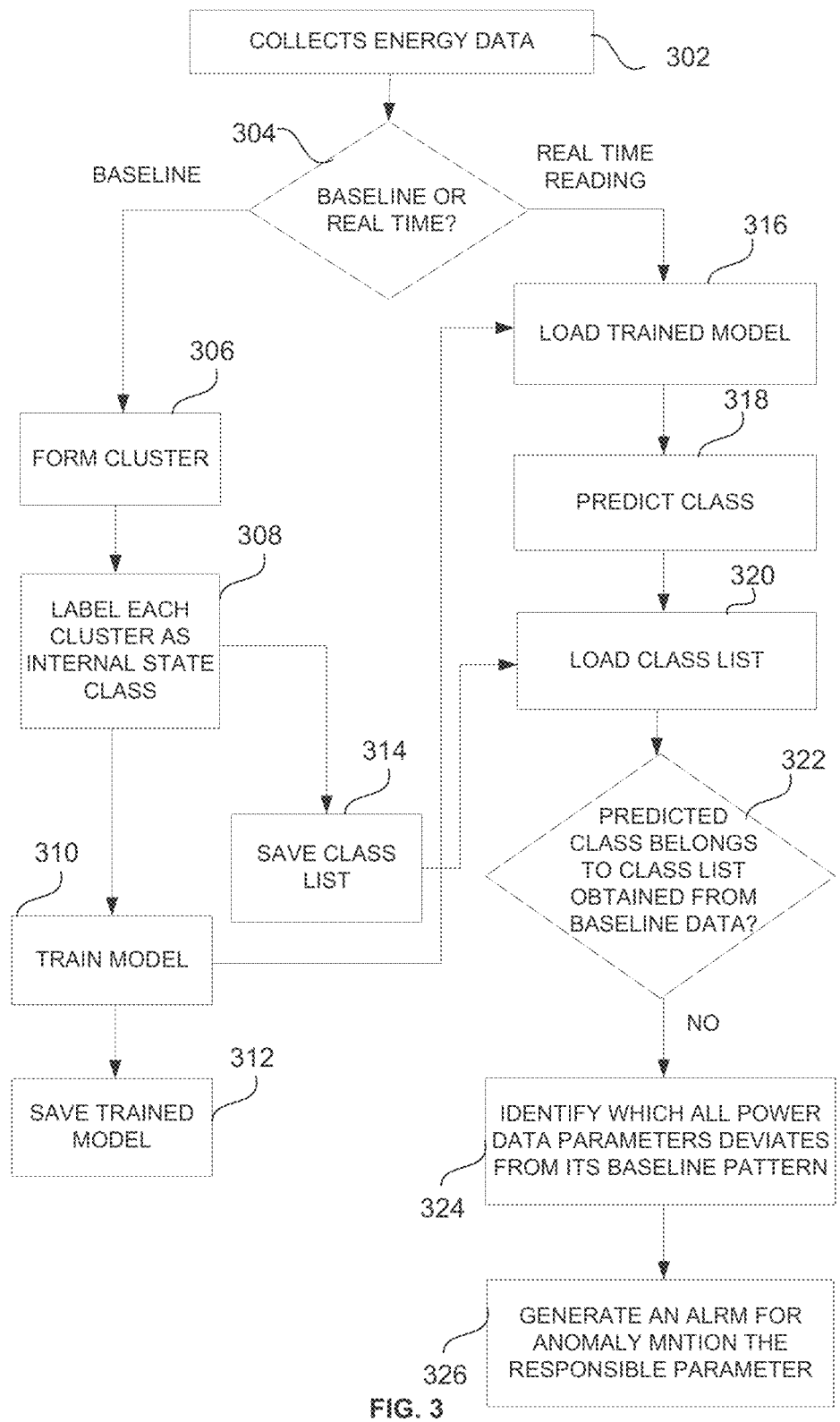
FIG. 3 is a flow diagram that illustrates a method to detect anomaly for individual appliance.

In some embodiments, the Energy Assistant Anomaly Detector System 101 comprises an anomaly detector module receives real time data from the database 202 and predicts the class of internal usage state of the real time data. FIG. 3 explains the work process of anomaly detector for individual electric device. Energy data collector 201 collects energy data from an electric appliance or an electric device from the one or more electric devices. For each appliance energy data are collected and saved as the baseline energy data.

Another embodiment consists of a method to form clusters from the baseline energy data. Each cluster represents internal usage state of the electric device wherein another embodiment labels these clusters as internal usage state class of the electric device and associated energy data parameters as the features of those classes. The method uses energy data parameters as features and internal states as classes from the baseline energy data and train a supervised machine learning model. The corresponding trained supervised machine learning model and all the classes with an associated list of the one or more electric devices are saved into the Energy Assistant Anomaly Detector System 101 for future use. Wherein another embodiment of the system receives the real time energy data and loads the trained machine learning model input of corresponding electric appliance from the one or more electric devices and predicts the internal usage state class. The Energy Assistant Anomaly Detector System 101 also loads the class list and if predicted class does not belong in class list then further verifies all the anomaly rules generated from baseline energy data and checks for which energy data parameters deviate from the usual energy data pattern of the electric appliance from the one or more electric devices. The Energy Assistant Anomaly Detector System 101 then generates an alarm of anomaly and mentions the energy data parameters responsible for anomaly. Energy parameters may be power consumption, voltage, current, power factor etc. The anomaly rules may be average power consumption or range of current draw. An example would be identifying anomalous usage behavior in a computer with respect to real time usage parameters of its resources such as CPU, Disk, Network connection etc., with respect to the Applications that are running on it. Each of these observations/measurements correspond to the energy parameters, and that are analysed using the clustering-based classification. By analysing the energy parameters for the computer using the Energy Assistant Anomaly Detector System 101, an unusual usage situation may be identified. The alert may be generated for an anomalous usage of the computer for the IT administrators indicating for possible security breaches or attacks based on the type of anomalous usage.

In some embodiments, the electrical device or an appliance may have various internal usage state when performing multiple tasks. Such internal state can be labelled as a class of the electrical device. For example, a vapor compression refrigeration cycle performs multi step task like compression, condensation, throttling and expansion. At the time of performing such tasks the refrigerator goes through various internal state where it consumes variable power and its relative power data parameters like current, voltage, power factor and power consumption may differ accordingly within threshold ranges. Therefore, at any instant of time certain appliance consuming abnormal energy outside of the threshold ranges which it usually does not consume in normal operating mode, may be considered as anomaly.

One type of anomaly is when quality of the power supply system may not be good and that may be causing a damage to the electrical appliance. In an aspect, these improper power supply may not persist for a long time, for example a sudden voltage shoot does not persist for long time but still harms the electrical appliance. Therefore, proper diagnostic and finding root cause of damage may not be possible at manufacturer place. In another aspect, a small earth leakage is responsible for malfunctioning of the electrical appliance or a device.

In another embodiment of the Energy Assistant Anomaly Detector System 101, comprises a dashboard that displays details energy consumption pattern on the energy data provider 103 of each of the appliances 207.*a* and also the overall energy distribution at the location. Wherein another anomaly module 207.*b* in dashboard depicts each anomaly details such as to when it occurred and how long it persisted and what are responsible energy parameters for anomaly to occur. The dashboard also comprises an alarm module 207.*c* that describes all the alarms related to power quality faults or anomaly occurrence. Wherein yet another dashboard 207.*d* displays the location based total energy consumption details as an aggregated consumption from all the appliances. The 207.*d* dashboard may show the energy consumption data and demand response behavior of the electric devices of the premises in real time.

FIG. 3 is a flow diagram that illustrates a method using the Energy Assistant Anomaly Detector System for performing anomaly detection according to some embodiments herein. At step 302, receives real time energy data of respective appliance. At step 304, identifies if it is baseline energy data or real time data. At step 316, loads the classification machine learning model. At step 318, predicts internal state class of real time data of respective appliance, and it also receives the anomaly rules from anomaly rule repository 205 and loads the class list at step 320. At step 322, verifies the predicted class against internal state classes from anomaly rules. At step 308, verifies the real time data against anomaly constraints and thresholds; checks if the predicted data does not belong to any of the internal state classes created during base line training. At step 324, labels the measurement as anomaly with responsible energy parameter details if energy parameters do not satisfy the thresholds or constraints from anomaly rules. Anomaly detector 326 detects and filters unusual energy consumption in order to better measure and estimate both normal energy consumption and demand response behavior. Rule engine 204 estimates and records minimum, maximum energy usage of individual appliance as well as overall energy usage of the operational premises. Rule engine 204 saves the energy usage pattern in rule repository for respective appliances. Therefore, at any instant of time if any appliance consume unusual energy which it does not consume in its ideal operational environment or in baseline period, anomaly detector 206 compares that real time reading with its time series energy consumption pattern from rule repository and if it differs then anomaly detector 206 creates an alert at 207.*c* about the anomalous energy consumption of the device.

In an embodiment, for training the classification machine learning model, the baseline data is determined to form clusters using cluster algorithm at step 306. At step 308, each cluster is labeled as a class based on the internal state of the electrical device. At step 314, the class list is saved in the database. At step 310, the classification machine learning model is trained using the baseline data. At step 312, the trained classification machine learning model is saved.

Figure 4:
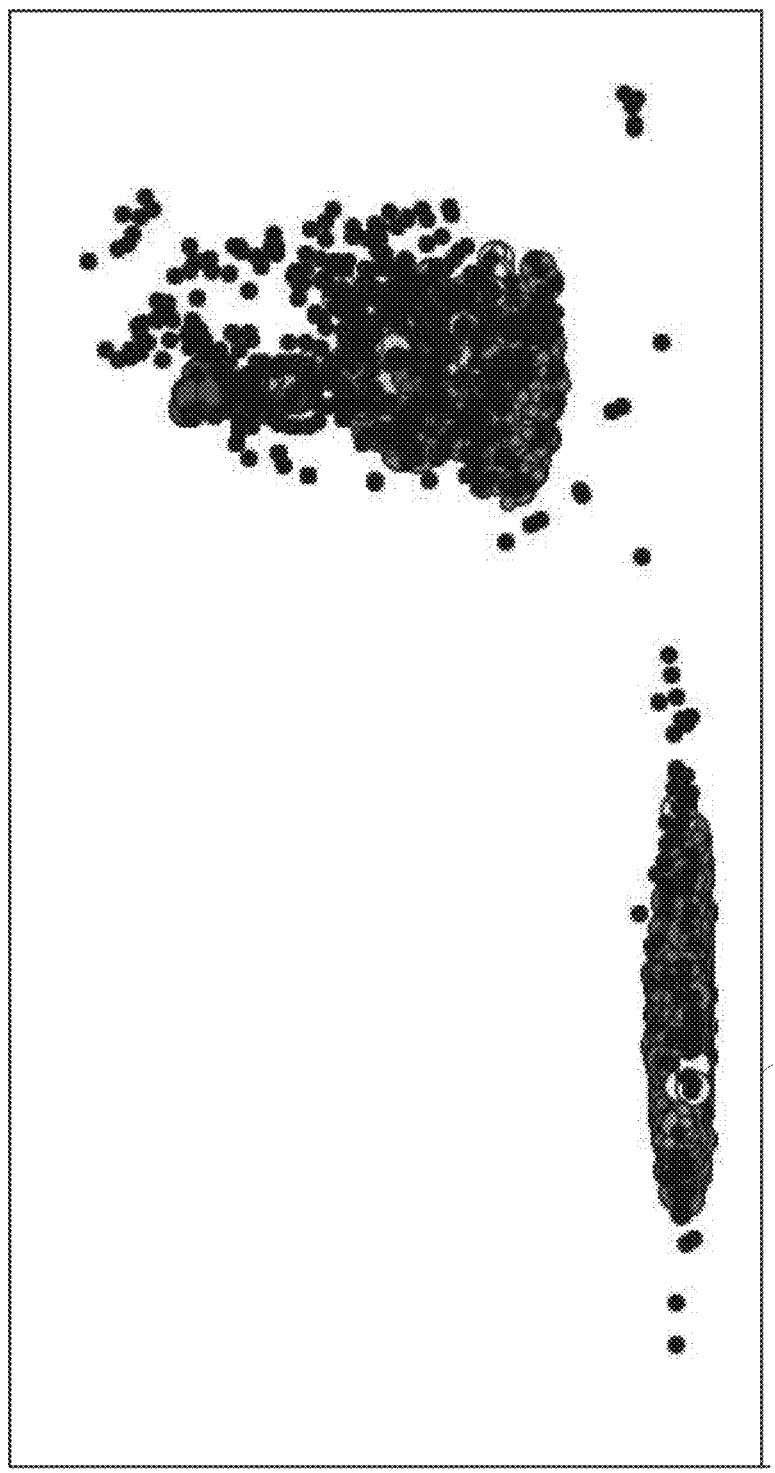
FIG. 4 illustrates an exemplary graphical representation of clustering result of internal state class of an appliances according to an embodiment herein.

FIG. 4 illustrates an exemplary graphical representation of clustering result of internal state class of an electric device 402 according to an embodiment herein. The clustering result of the internal state class of the electric device/appliances 402 explores all the internal working states by performing cluster-based algorithm form the baseline data of respective appliances module 203, each data points is labelled with its internal state class and a classification model is created with labelled data. This trained model is further used for anomaly detection to identify the internal class of any new datapoint (energy parameters). The method is applicable in different systems such as security etc.

Figure 5B:
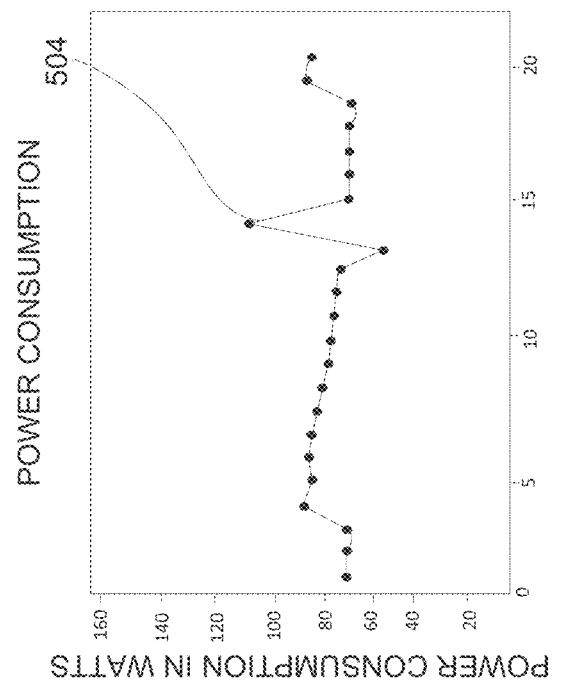
FIGS. 5A and 5B illustrate an exemplary anomaly graph of an electrical device of FIG. 1 according to an embodiment herein.
Figure 5A:
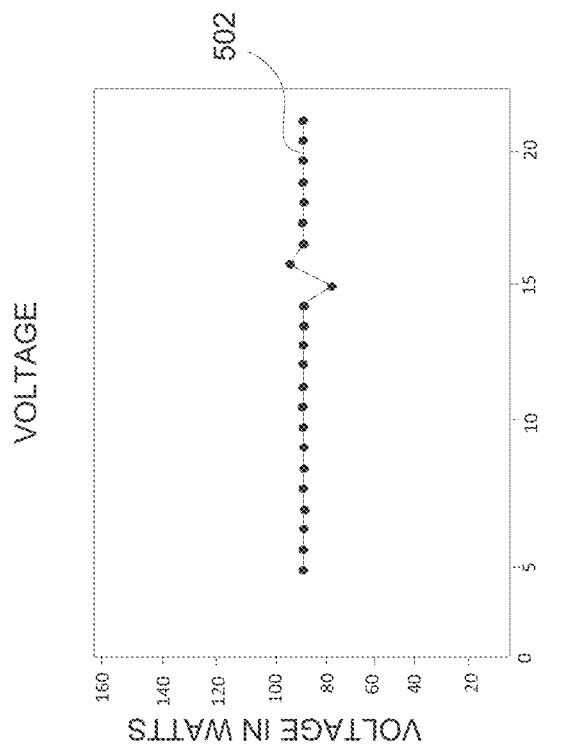

FIGS. 5A and 5B illustrates an anomaly graph obtained from an electrical device according to an embodiment herein. The voltage graph clearly displays the fluctuation history of voltage and due to that the power consumption pattern also differs than its regular range. In an ideal power supply, the voltage range should be 228-232 volt as the baseline energy consumption as 502, from FIG. 5A it shows that voltage changes to around 196 volt to 244 volts in a short time, which is harmful for electrical appliances. From FIG. 5B it can be seen that the energy consumption of the appliance range was 60-85 watts, but due to voltage fluctuation power consumption also abnormally become 45 watts to 120 watts shown at 504 that differs from its baseline energy consumption range. In an embodiment, the power-factor of an equipment can change unusually due to malfunctioning, in which case, even if voltage is within limits, it will be called as an 'anomalous event' in time. Note that power-factor is a feature used in clustering.

Figure 6:
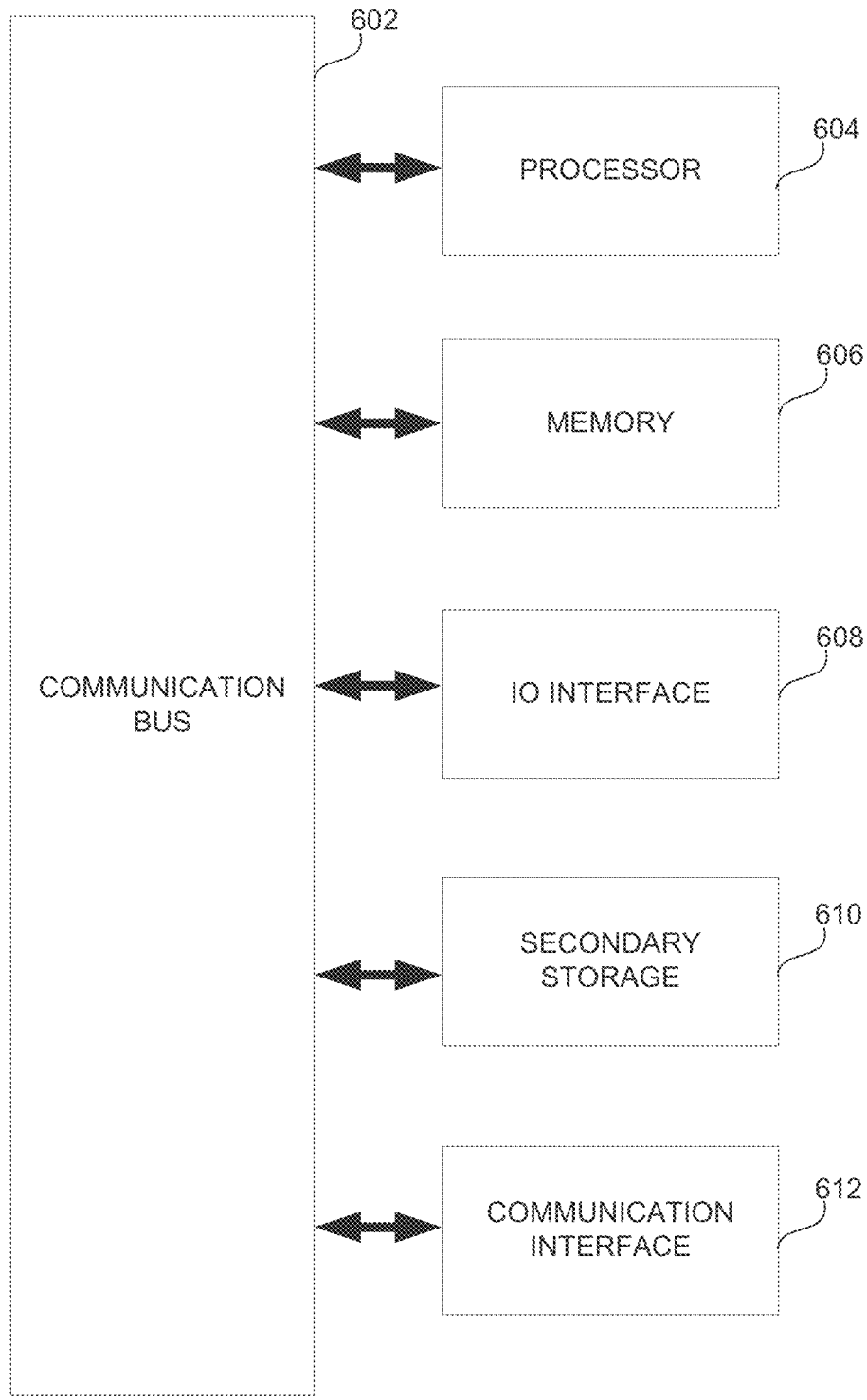
FIG. 6 illustrates an exploded view of the enterprise network of FIG. 1 according to the embodiments herein.

FIG. 6 illustrates an exploded view of the enterprise network 102 of FIG. 1 according to the embodiments herein. The enterprise network 102 having a memory 604 having a set of computer instructions, a bus 604, a display 606, a speaker 608, and a processor 610 capable of processing a set of instructions to perform any one or more of the methodologies herein, according to an embodiment herein. The processor 610 may also enable digital content to be consumed in the form of video for output via one or more displays 606 or audio for output via speaker and/or earphones 608. The processor 610 may also carry out the methods described herein and in accordance with the embodiments herein.

The embodiments herein can take the form of, an entirely hardware embodiment, an entirely software embodiment or an embodiment including both hardware and software elements. The embodiments that are implemented in software include but are not limited to, firmware, resident software, microcode, etc. Furthermore, the embodiments herein can take the form of a computer program product accessible from a computer-usable or computer-readable medium providing program code for use by or in connection with a computer or any instruction execution system. For the purposes of this description, a computer-usable or computer readable medium can be any apparatus that can comprise, store, communicate, propagate, or transport the program for use by or in connection with the instruction execution system, apparatus, or device.

The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output (I/O) devices (including but not limited to keyboards, displays, pointing devices, remote controls, etc.) can be coupled to the system either directly or through intervening I/O controllers. Network adapters may also be coupled to the system to enable the data processing system to become coupled to other data processing systems or remote printers or storage devices through intervening private or public networks. Modems, cable modem and Ethernet cards are just a few of the currently available types of network adapters.

This schematic drawing illustrates a hardware configuration of an information handling/computer system in accordance with the embodiments herein. The system comprises at least one processor or central processing unit (CPU). The CPUs are interconnected via system bus to various devices such as a random access memory (RAM), read-only memory (ROM), and an input/output (I/O) adapter. The I/O adapter can connect to peripheral devices, such as disk units and tape drives, or other program storage devices that are readable by the system. The system can read the inventive instructions on the program storage devices and follow these instructions to execute the methodology of the embodiments herein.

The system further includes a user interface adapter that connects a keyboard, mouse, speaker, microphone, and/or other user interface devices such as a touch screen device (not shown) or a remote control to the bus to gather user input. Additionally, a communication adapter connects the bus to a data processing network, and a display adapter connects the bus to a display device which may be embodied as an output device such as a monitor, printer, or transmitter, for example.

The advantages of the system include no need for additional device, only the energy consumption data is used to detect the anomaly. Also, there is no high computational requirement for this system and method to identify the anomaly. The method provides a long term solution for managing electrical appliances. The system and method is widely applicable in any system with multi-dimensional features and possibility of anomalies. It has use in monitoring and managing security systems.

The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of preferred embodiments, those skilled in the art will recognize that the embodiments herein can be practiced with modification within the spirit and scope.

What is claimed is:

1. A system of monitoring electrical devices to detect anomaly in an electrical device by determining different internal states of the electrical device, comprising
at least one memory that stores computer-executable instructions;
at least one processor configured to access the at least one memory, wherein the at least one processor is configured to execute the computer-executable instructions to:

receive, from an energy data provider comprising one or more power sensors, at least one of baseline energy consumption data or real-time energy consumption data of at-least one electrical device on a defined interval basis, wherein the baseline energy consumption data or the real-time energy consumption data comprises one or more of (i) current, (ii) voltage, (iii) power consumption, and (iv) power factor of the at-least one electrical device;

wherein, when the at least one processor receives the baseline energy consumption data of the at-least one electrical device, the at least one processor is configured to:

generate one or more internal usage states of the at-least one electrical device by analyzing the baseline energy consumption data and generating one or more cluster groups or clusters using a cluster based algorithm executed by the processor;

classify, using the cluster based algorithm executed by the processor, the one or more cluster groups or clusters into one or more classes based on the one or more internal usage states of the at-least one electrical device and select power data parameters comprising (i) current, (ii) voltage, (iii) power consumption, and (iv) power factor of the at-least one electrical device;

label, using a classification based algorithm executed by the processor, baseline data for the at-least one electrical device by analyzing the baseline energy consumption data and the one or more internal usage states of the at-least one electrical device;

generate, using a rule engine executed by the processor, a set of anomaly detection rules for the at-least one electrical device by generating threshold and constraints for anomaly detection by analyzing the baseline energy consumption data, and the one or more internal usage states of the at-least one electrical device; and train a machine learning model with the one or more classes and the one or more internal usage states from the baseline energy consumption data of the at-least one electrical device to generate a trained machine learning model;

wherein, when the at least one processor receives the real-time energy consumption data of the at-least one electrical device, the at least one processor is configured to:

implement the trained machine learning model for the at-least one electrical device for detecting anomalies in the real-time energy consumption data;

predict, using the trained machine learning model, real-time internal usage states of the at-least one electrical device based on the real-time energy consumption data;

validate, using the trained machine learning model, the real-time internal usage states using the one or more classes and the one or more internal usage states of the at-least one electrical device, and the real-time energy consumption data with the set of anomaly detection rules comprising the threshold and constraints of the at-least one electrical device; and determine, using the trained machine learning model, the anomaly using the power data parameters if the real-time power consumption data does not satisfy the set of anomaly detection rules.

2. The system of claim 1, wherein the at least one processor is further configured to execute the computer-executable instructions to perform cluster-based pattern matching algorithm and classification-based algorithm on baseline energy consumption data for each appliance separately and label those baseline data as a benchmark database for anomaly detector and store in the at least one memory.

3. The system of claim 1, wherein the at least one processor is further configured to execute the computer-executable instructions to filter the detected anomalies from the energy consumption data and label them as anomalies in the database and also store corresponding current parameters responsible for the anomaly.

4. The system of claim 3, wherein the at least one processor is further configured to execute the computer-executable instructions to estimate energy consumption at the location based at least in part on the monitored energy consumption data, wherein unusual energy consumption in any device or equipment can be identified as an anomaly.

5. The system of claim 1, wherein the classification-based algorithm is selected when a real time energy consumption data is received from the energy data provider and detects the class of the energy consumption data point.

6. One or more non-transitory computer-readable media storing computer-executable instructions that, when executed by at least one processor, configure the at least one processor to perform operations comprising:

receiving, from an energy data provider comprising one or more power sensors, at least one of baseline energy consumption data or real-time energy consumption data of at least one electrical device on a defined interval basis, wherein the baseline energy consumption data or the real-time energy consumption data comprises one or more of (i) current, (ii) voltage, (iii) power consumption, and (iv) power factor of the at-least one electrical device;

wherein, when the at least one processor receives the baseline energy consumption data of the at-least one electrical device, the at least one processor perform operations comprising:

generating one or more internal usage states of the at-least one electrical device by analyzing the baseline energy consumption data and generating one or more cluster groups or clusters using a cluster based algorithm executed by the processor;

classifying, using the cluster based algorithm executed by the processor, the one or more cluster groups or clusters into one or more classes based on the one or more internal usage states of the at-least one electrical device and select power data parameters comprising (i) current, (ii) voltage, (iii) power consumption, and power factor of the at-least one electrical device;

labelling, using a classification based algorithm executed by the processor, baseline data for the at-least one electrical device by analyzing the baseline energy consumption data and the one or more internal usage states of the at-least one electrical device;

generating, using a rule engine executed by the processor, a set of anomaly detection rules for the at-least one electrical device by generating threshold and constraints for anomaly detection by analyzing the baseline energy consumption data, and the one or more internal usage states of the at-least one electrical device; and training a machine learning model with the one or more classes and the one or more internal usage states from the baseline energy consumption data of the at-least one electrical device to generate a trained machine learning model;

wherein, when the at least one processor receives the real-time energy consumption data of the at-least one electrical device, the at least one processor perform operations comprising:

implementing the trained machine learning model for the at-least one electrical device for detecting anomalies in the real-time energy consumption data;

predicting, using the trained machine learning model, real-time internal usage states of the at-least one electrical device based on the real-time energy consumption data;

validating, using the trained machine learning model, the real-time internal usage states using the one or more classes and the one or more internal usage states of the at-least one electrical device, and the real-time energy consumption data with the set of anomaly detection rules comprising the threshold and constraints of the at-least one electrical device; and determining, using the trained machine learning model, the anomaly using the power data parameters if the real-time power consumption data does not satisfy the set of anomaly detection rules.

7. The one or more non-transitory computer-readable media storing computer-executable instructions of claim 6, when executed by at least one processor, wherein a generic algorithm of detecting anomalies on heterogenous electric or electrical device on real time basis.

8. The one or more non-transitory computer-readable media storing computer-executable instructions of claim 6, when executed by at least one processor, wherein an alarm system or a dashboard is provided to display an alert.

* * * * *